(12) United States Patent
van den Oever (10) Patent No.: US 8,410,572 B2
(45) Date of Patent: Apr. 2, 2013

(54) BIPOLAR TRANSISTOR WITH EMITTER AND/OR COLLECTOR CONTACT STRUCTURE FORMING A SCHOTTKY CONTACT AND METHOD OF PRODUCTION

(75) Inventor: Léon C. M. van den Oever, Rosmalen (NL)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/124,091

(22) PCT Filed: Oct. 22, 2009

(86) PCT No.: PCT/EP2009/063921
§ 371 (c)(1),
(2), (4) Date: Jun. 28, 2011

(87) PCT Pub. No.: WO2010/046449
PCT Pub. Date: Apr. 29, 2010

(65) Prior Publication Data
US 2011/0248375 A1 Oct. 13, 2011

(30) Foreign Application Priority Data
Oct. 24, 2008 (EP) .................................. 08167538

(51) Int. Cl.
| | | |
|---|---|---|
| H01L 27/095 | (2006.01) | |
| H01L 29/47 | (2006.01) | |
| H01L 29/812 | (2006.01) | |
| H01L 31/07 | (2012.01) | |
| H01L 31/108 | (2006.01) | |
| H01L 29/00 | (2006.01) | |
| H01L 27/082 | (2006.01) | |
| H01L 27/102 | (2006.01) | |
| H01L 29/70 | (2006.01) | |
| H01L 31/11 | (2006.01) | |
| H01L 21/331 | (2006.01) | |

(52) U.S. Cl. ........ 257/474; 257/557; 257/565; 257/573; 257/584; 257/587; 257/E21.374; 257/E21.608; 257/E27.053; 257/E29.045; 257/E29.148

(58) Field of Classification Search .................. 257/557, 257/565, 573, 584, 587, E21.608, E27.053, 257/E29.045, 474, E21.374, E29.148; 438/355, 438/335
See application file for complete search history.

(56) References Cited

U.S. PATENT DOCUMENTS
(Continued)

FOREIGN PATENT DOCUMENTS
| | | |
|---|---|---|
| EP | 0 443 852 A1 | 8/1991 |
| FR | 2 301 924 A1 | 9/1976 |

(Continued)

OTHER PUBLICATIONS

Bhattacharya, U., et al., "Schottky-Collector Heterojunction Bipolar Transistors: Device Scaling Laws for $f_{max}$ beyond 500 GHz," IEEE Electron Devices Letters, vol. 16, No. 8, Aug. 1995, pp. 357-359, IEEE.

(Continued)

Primary Examiner — Ida M Soward
(74) Attorney, Agent, or Firm — Slater & Matsil, L.L.P.

(57) ABSTRACT

A base contact connection, an emitter structure and a collector structure are arranged on an n-layer, which can be provided for additional npn transistors. The collector structure is arranged laterally to the emitter structure and at least one of the emitter and collector comprises a Schottky contact on a surface area of the n-layer.

16 Claims, 4 Drawing Sheets

U.S. PATENT DOCUMENTS

| | | | |
|---|---|---|---|
| 4,107,719 A | | 8/1978 | Graul et al. |
| 4,412,376 A | | 11/1983 | De Bar et al. |
| 4,821,090 A | * | 4/1989 | Yokoyama .................... 257/195 |
| 4,916,083 A | * | 4/1990 | Monkowski et al. .......... 438/367 |
| 5,212,102 A | * | 5/1993 | Iranmanesh et al. .......... 438/328 |
| 5,391,504 A | * | 2/1995 | Hill et al. ...................... 438/170 |
| 5,401,999 A | * | 3/1995 | Bayraktaroglu ............... 257/458 |
| 5,438,218 A | | 8/1995 | Nakamura et al. |
| 5,567,961 A | * | 10/1996 | Usagawa et al. ............... 257/197 |
| 5,574,306 A | * | 11/1996 | Wang et al. .................... 257/557 |
| 5,674,778 A | * | 10/1997 | Lee et al. .......................... 438/24 |
| 6,406,965 B1 | * | 6/2002 | Lammert ........................ 438/312 |
| 6,852,580 B2 | * | 2/2005 | Yanagihara et al. ........... 438/170 |
| 6,876,060 B2 | * | 4/2005 | Ikeda ............................. 257/566 |
| 6,888,710 B2 | * | 5/2005 | Mallikarjunaswamy et al. ................................ 361/56 |
| 6,953,981 B1 | * | 10/2005 | Johansson et al. ............. 257/503 |
| 7,009,261 B2 | * | 3/2006 | Nakashima .................... 257/378 |
| 7,049,201 B2 | * | 5/2006 | Verma et al. ................... 438/312 |
| 7,132,320 B2 | * | 11/2006 | Kurokawa et al. ............. 438/170 |
| 7,297,991 B2 | * | 11/2007 | Chen .............................. 257/183 |
| 7,547,958 B2 | * | 6/2009 | Toyoda .......................... 257/565 |
| 7,868,414 B2 | * | 1/2011 | Williams et al. ............... 257/513 |
| 7,898,008 B2 | * | 3/2011 | Fallica et al. .................. 257/273 |
| 8,044,488 B2 | * | 10/2011 | Arai et al. ...................... 257/511 |
| 2001/0035564 A1 | * | 11/2001 | Ejiri ............................... 257/565 |
| 2002/0079554 A1 | * | 6/2002 | Okawa et al. .................. 257/565 |

FOREIGN PATENT DOCUMENTS

| | | | |
|---|---|---|---|
| GB | 1 495 864 A | | 12/1977 |
| JP | 07038079 A | * | 2/1995 |
| WO | WO 2007/128075 A2 | | 9/1976 |
| WO | WO 2005/081768 A2 | | 9/2005 |

OTHER PUBLICATIONS

Kumar, M.J., et al., "A New Lateral PNM Schottky Collector Bipolar Transistor (SCBT) on SOI for Nonsaturating VLSI Logig Design," IEEE Transactions on Electron Devices, vol. 49, No. 6, Jun. 2002, pp. 1070-1072, IEEE.

Kumar, M.J., et al., "A New Lateral SiGe-Base PNM Schottky Collector Bipolar Transistor on SOI for Non-saturating VLSI Logic Design," IEEE 16$^{th}$ International Conference on VLSI Design, Jan. 4-8, 2003, pp. 489-492, IEEE.

Henderson, T., et al., "High-Performance BiHEMT HBT / E-D pHEMT Integration," CS Mantech Conference, May 14-17, 2007, 4 pages.

Lin, C.K., et al., "Monolithic Integration of E/D-mode pHEMT and InGaP HBT Technology on 150mm GaAs Wafers," CS Mantech Conference, May 14-17, 2007, pp. 251-254.

Peatman, W., et al., "InGaP-*Plus*™ : Advanced GaAs BiFET Technology and Applications," CS Mantech Conference, May 14-17, 2007, pp. 243-246.

Ramanathan, R., et al., "Commercial Viability of a Merged HBT-FET (BiFET) Technology for GaAs Power Amplifiers," CS Mantech Conference, May 14-17, 2007, pp. 255-259.

* cited by examiner

BIPOLAR TRANSISTOR WITH EMITTER AND/OR COLLECTOR CONTACT STRUCTURE FORMING A SCHOTTKY CONTACT AND METHOD OF PRODUCTION

This patent application is a national phase filing under section 371 of PCT/EP2009/063921, filed Oct. 22, 2009, which claims the priority of European patent application 08167538.1, filed Oct. 24, 2008, each of which is incorporated herein by reference in its entirety.

TECHNICAL FIELD

The field of this invention is the production of pnp bipolar transistors in gallium arsenide technology.

BACKGROUND

Power amplifiers, especially for industrial applications, are preferably realized in GaAs technology, which provides only npn bipolar transistors but no pnp bipolar transistors. Complete integrated circuit designs are therefore not possible in GaAs technology. Pnp bipolar transistors or p- type field-effect transistors can be provided on silicon chips, but a hybrid circuit concept suffers from increased current consumption and requires large device areas. In view of low cost and easy manufacturing processes, a complete integration of all the devices in GaAs technology is desired.

SUMMARY OF THE INVENTION

In one aspect, this invention presents a bipolar transistor with an n-type base that can be produced in GaAs technology, and a method of producing a bipolar transistor with n-type base in GaAs.

The invention provides a bipolar transistor with a lateral collector. A base contact connection is electrically conductively connected to an n-layer. An emitter contact connection formed from a metal is electrically conductively connected to an emitter structure comprising either a) a Schottky contact formed by the emitter contact connection on an area of the surface of the n-layer or b) a $p^+$-layer, which is arranged on an area of the surface of the n-layer, the emitter contact connection being electrically conductively connected to the $p^+$-layer.

A collector contact connection formed from a metal is electrically conductively connected to a collector structure, which is arranged laterally to the emitter structure with respect to the surface of the n-layer and comprises either a) a Schottky contact formed by the collector contact connection on an area of the surface of the n-layer or b) a $p^+$-layer, which is arranged on an area of the surface of the n-layer, the collector contact connection being electrically conductively connected to the $p^+$-layer.

At least one of the emitter contact connection and the collector contact connection forms a Schottky contact on an area of the surface of the n-layer. This structure has the advantage that it can be manufactured within a technology of production of GaAs devices including npn bipolar transistors.

An embodiment of the bipolar transistor comprises a substrate, which may be GaAs, and an n+-region at a surface of the substrate. The n-layer is arranged on the n+-region. The base contact connection is arranged above an area of the n+-region that is not covered by the n-layer.

In a further embodiment of the bipolar transistor, a base contact layer formed from a metal is applied to the n+-region and makes an ohmic contact with the n+-region. The base contact connection is applied to the base contact layer.

In a further embodiment of the bipolar transistor, the n– layer is part of a mesa.

In a further embodiment of the bipolar transistor, a $p^+$-layer is arranged on the n-layer. The emitter contact connection is electrically conductively connected to the $p^+$-layer. The collector contact connection is arranged on the surface of the n-layer and forms a collector Schottky contact at the interface between the collector contact connection and the semiconductor material of the n-layer. The portions of the $p^+$-layer and the Schottky contact are arranged laterally to one another. The $p^+$-layer can be provided for a base layer of additional npn bipolar transistors. The lateral arrangement of the p-type emitter and the Schottky diode provided as a collector on the same surface of the n-layer uses only production steps that are compatible with standard GaAs technology, so that the production is optimally cost effective.

In a further embodiment of the bipolar transistor, the emitter contact connection forms an emitter Schottky contact on an area of the surface of the n-layer, and the collector structure comprises a $p^+$-layer, which is arranged on an area of the surface of the n-layer.

In a further embodiment of the bipolar transistor, the emitter contact connection forms a Schottky contact on an area of the surface of the n-layer, and the collector contact connection also forms a Schottky contact on a further area of the surface of the n-layer.

This device structure not only provides a means of producing bipolar transistors with n-type base in the material system of gallium arsenide, but allows the production of bipolar transistors with n-type base and npn transistors integrated in the same device. The emitter-base part of the bipolar transistor with n-type base is arranged vertically, whereas the base-collector part of the bipolar transistor with n-type base is arranged laterally. Since the n-layer that serves as the base layer of the bipolar transistor with n-type base can also be used as a collector layer of additional npn transistors, the n-layer can be arranged on an n+-region, which is located at a surface of a semiconductor substrate of GaAs and which is provided as a subcollector for additional npn transistors to reduce the ohmic track resistance of the exterior connection to the collector layer of the npn transistors. The n-layer is arranged directly on the n+-region, which can be used in the bipolar transistor with n-type base to provide an electric connection of low ohmic resistance between the base contact connection and the n-layer, which serves as a base layer of the bipolar transistor with n-type base. Further, a metal base contact layer can be arranged on the surface of the n+-region, and the base contact connection can be arranged on the base contact layer. The n-layer and the $p^+$-layer can be structured to form a mesa, which can be electrically isolated at the sidewalls and between the contact connections on the upper side. If a base contact layer is provided, the n-layer is arranged in such a fashion that it does not cover all of the upper surface of the n+-region but leaves an area of this surface free, on which the base contact layer is placed. This metal contact layer can also be used as collector contact layer for additional npn transistors.

A method of producing the bipolar transistor with n-type base comprises the steps of forming an n-layer of semiconductor material and forming an emitter structure and a collector structure on the n-layer. The emitter structure and the collector structure may be produced by applying a $p^+$-layer on the n-layer and a contact layer, formed from a metal, on the $p^+$-layer or by applying a contact connection, formed from a metal, on the n-layer, forming a Schottky contact on the n-layer.

The method can further comprise applying a manufacturing process of an npn bipolar transistor to produce a sequence comprising an n+-region, an n-layer and a p+-layer. The n+-region can be provided to form a subcollector layer of an additional npn bipolar transistor, the n-layer to form a collector layer of the additional npn bipolar transistor and the p+-layer to form a base layer of the additional npn bipolar transistor.

The method can further comprise forming a base contact layer on the n+-region and an emitter contact layer on the p+-layer, and applying an emitter contact connection to the emitter contact layer, a base contact connection to the base contact layer and a collector contact connection to the n-layer, the collector contact connection forming a Schottky contact on the n-layer.

This manufacturing process can especially use a GaAs HBT technology, which was heretofore only applied to the manufacturing of npn bipolar transistors.

BRIEF DESCRIPTION OF THE DRAWINGS

After the following brief description of the drawings, a more detailed description of embodiments and examples of the bipolar transistor and the method of production will be given in conjunction with the appended claims and drawings.

DETAILED DESCRIPTION OF ILLUSTRATIVE EMBODIMENTS

Figure 1:
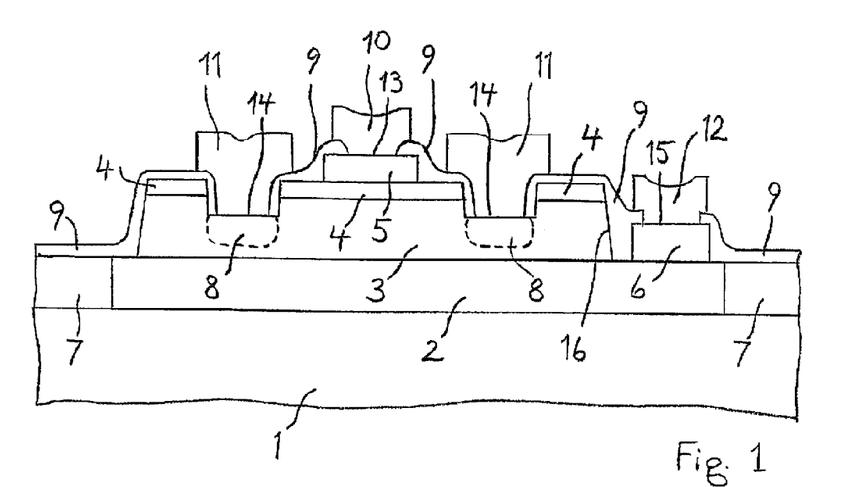
FIG. 1 shows a cross-section of an embodiment of the bipolar transistor with n-type base comprising a collector Schottky contact.

FIG. 1 shows a cross-section of an embodiment of the bipolar transistor with n-type base. An n+-region 2 is formed at an upper surface of a substrate 1, which can be GaAs. An n-layer 3 is arranged on the n+-region 2, and a p+-layer 4 is arranged on the n-layer 3. In this embodiment, the n-layer 3 and the p+-layer 4 are laterally slightly more confined than the n+-region 2 and form a mesa 16. The layers can be provided for additional npn transistors, which can be produced on the same substrate 1 within the same manufacturing process. An emitter contact layer 5, which is preferably metal, is optionally arranged on the surface of the p+-layer 4.

On a surface area of the n-layer 3 that is not covered by the p+-layer 4, a collector contact connection 11 that is formed from a metal is applied on the n-layer 3. The collector contact connection 11 makes a Schottky contact at the interface between the metal and the semiconductor material of the n-layer 3. The Schottky contact is provided as collector Schottky contact 14 of the transistor. In this embodiment, the collector Schottky contact 14 comprises two separate interface areas between the n-layer 3 and the collector contact connection 11, which are shown in FIG. 1 on the left and right sides with respect to the emitter contact layer 5.

In order to provide an external base connection, a base contact layer 6, which is preferably metal, is arranged on an area of the upper surface of the n+-region 2 which is not covered by the n-layer 3. The base contact layer 6 is provided with a base contact connection 12.

An emitter contact connection 10 is provided for the emitter and is in direct contact with the emitter contact layer 5. The n+-region 2 is laterally surrounded by an isolating region 7, which can be formed by an isolation implantation into the substrate 1, for example. A dielectric layer 9 can be applied on the upper surface to insulate the electrically conductive components from one another. The dielectric layer 9 especially covers the flanks of the mesa 16 that is formed by the n-layer 3 and the p+-layer 4. Space charge regions 8, which are generated under the collector Schottky contacts 14, are indicated with broken lines in FIG. 1. The lateral and vertical extensions of the space charge regions 8 can deviate from those represented in FIG. 1, depending on the operation conditions of the transistor, especially the applied electric potentials.

Figure 2:
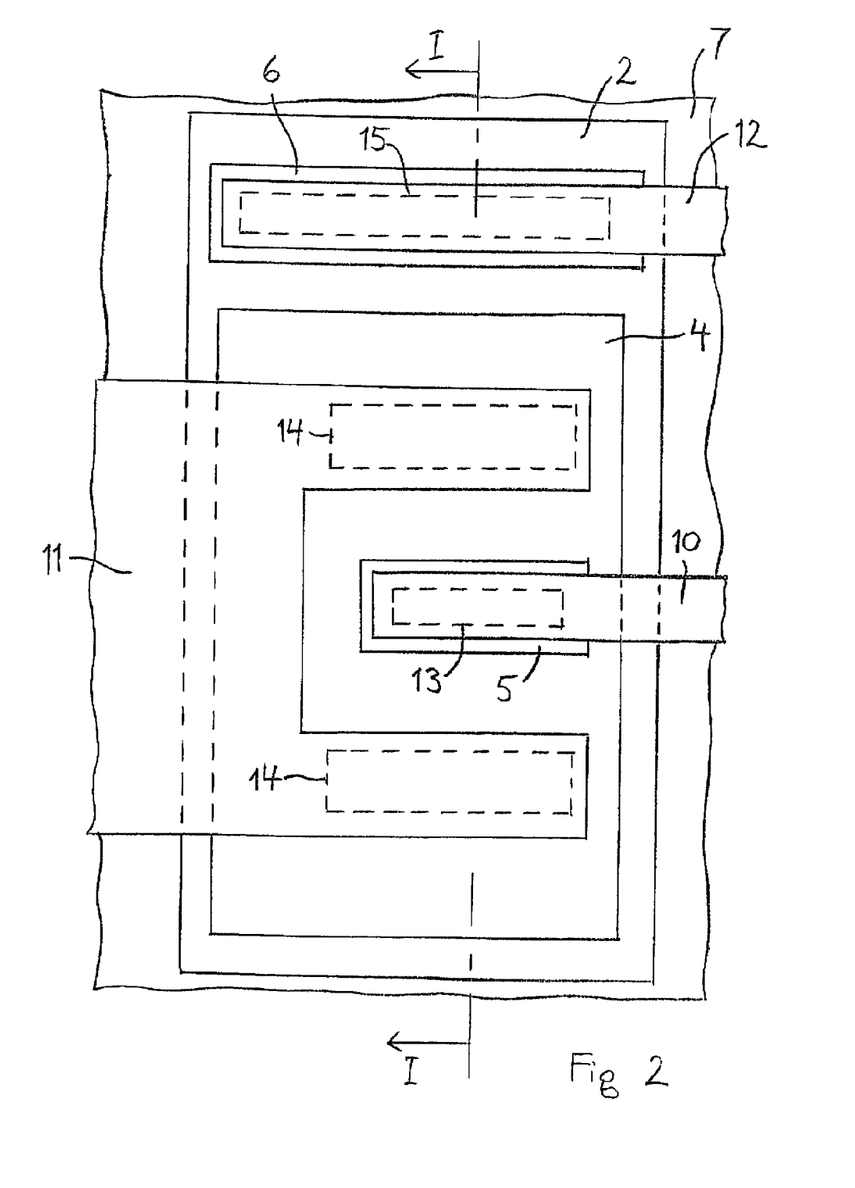
FIG. 2 shows a plan view of the embodiment according to FIG. 1.

FIG. 2 is a plan view onto the embodiment according to FIG. 1 not showing the dielectric layer 9. The position of the cross-section of FIG. 1 is indicated in FIG. 2. FIG. 2 shows the surface of the isolating region 7 surrounding the n+-region 2, the laterally more confined p+-layer 4 located above the n+-region 2 and covering the n-layer 3, and the marginal surface areas of the emitter contact layer 5 and the base contact layer 6. The arrangement of the emitter contact connection 10, the collector contact connection 11, and the base contact connection 12 as well as the areas of the emitter contact 13, the collector Schottky contact 14 and the base contact 15 are also shown in the plan view. Since the contacts 13, 14, 15 are covered by the connections 10, 11, 12, their hidden contours are represented by broken lines. The layout shown in FIG. 2 is only an example and can be modified and varied according to the requirements of different embodiments of the transistors. The contact connections are preferably a metal and can be any metal that is used in a standard GaAs HBT technology. For good device operation it is preferred to have the collector Schottky contact 14 on opposite sides of the emitter contact 13 as shown in FIG. 2. In further embodiments, the emitter contact connection 10 and the collector contact connection 11 can be interdigitated, i.e., both connections have fingershaped extensions in comblike fashion, which are arranged in alternating sequence. A variety of derivatives of this layout and device structure are possible within the scope of this invention. The emitter contact connection 10 and/or the collector contact connection 11 can be formed in the shape of a ring or frame or have a strip-like shape. Different area ratios of the base contact 15 and the interface between the n+-region 2 and the n-layer 3 forming the base are possible. The layout can have more or less symmetry, and a plurality of different transistor types can be integrated in the same IC chip. Although the Schottky contact is preferred in the collector, the Schottky contact can instead be provided for the emitter.

When operating the transistor, holes are injected into the n-layer and are captured and collected by the space charge region of the Schottky contact 14, thus giving a collector current. Electrons are injected in the p+-layer 4, thus giving a base current. The current level may be relatively high because of the relatively thin p+-layer 4, although the doping can be high in order to reduce electron injection. Holes that are injected into the n+-region 2 recombine with electrons and give rise to extra base current. This hole injection depends on the pn junction area.

Figure 3:
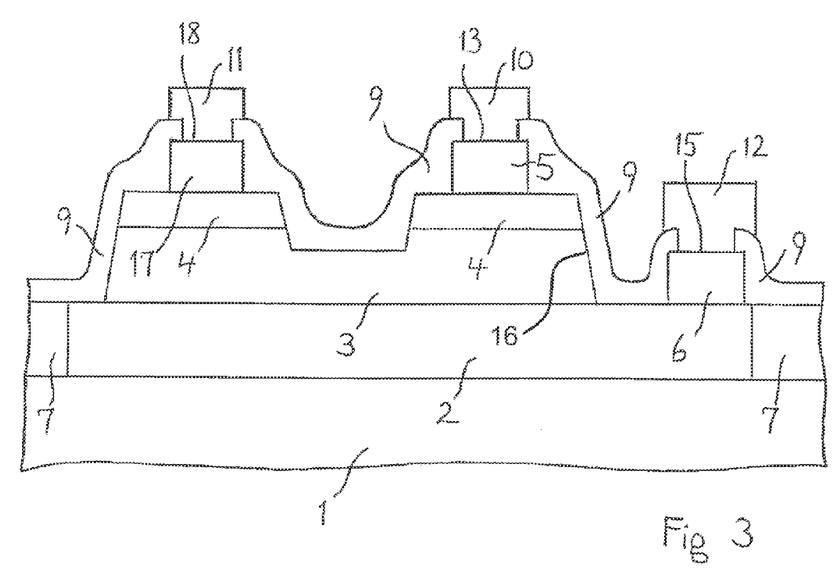
FIG. 3 shows a cross-section of a bipolar transistor with n-type base having emitter and collector arranged on a p+-layer.

FIG. 3 shows a cross-section of a bipolar transistor with lateral collector. A sequence comprising an n+-region 2, an n-layer 3 and a p+-layer 4 is arranged on an upper surface of the substrate 1, which can be GaAs. As in the previous embodiment, the n-layer 3 and the p+-layer 4 are laterally slightly more confined than the n+-region 2 and form a mesa 16. An emitter contact layer 5, which is preferably metal, is arranged on the surface of the p$^+$-layer 4. A collector contact layer 17, which is preferably also metal, is arranged on the surface of the p$^+$-layer 4, laterally to the emitter structure. The emitter contact connection 10 and the collector contact connection 11 are applied to the emitter contact layer 5 and the collector contact layer 17, respectively. The presence of the emitter contact layer 5 and the collector contact layer 17 is preferred, but the emitter contact connection 10 and the collector contact connection 11 can instead be applied directly to the surface of the p$^+$-layer 4.

Compared to a lateral bipolar transistor according to FIG. 3, in which both emitter and collector comprise a metal layer that is applied to the p$^+$-layer 4, the embodiment according to FIG. 1 has a better current gain. The performance of the embodiment of FIG. 1 depends on the control of the currents and the space charge regions. The space charge regions are predominantly in the n-layer 3, as shown in FIG. 1, resulting in a significant base modulation as a function of the base-collector voltage. To obtain a good current gain, the emitter needs to act as a point/line source, and the collector should be constructed around the emitter to capture and collect the injected holes. The lateral extension of the space charge regions can be used to enhance hole capturing and collection, but attention must be paid to a possible reach-through between emitter and collector.

Figure 4:
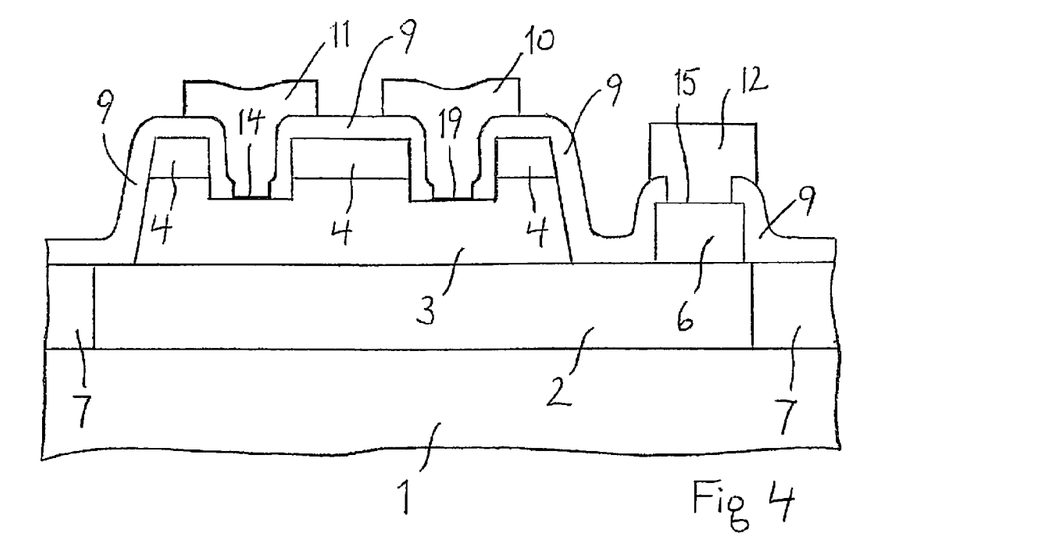
FIG. 4 shows a cross-section of a further embodiment of the bipolar transistor with n-type base having emitter and collector Schottky contacts.

FIG. 4 shows a cross-section of a further embodiment, which also comprises the sequence of an n+-region 2, an n-layer 3 and a p$^+$-layer 4 on an upper surface of the substrate 1, which can be GaAs. An emitter contact connection 10 and a collector contact connection 11 are applied directly to areas of the surface of the n-layer 3 in recesses of the p$^+$-layer 4. The emitter contact connection 10 forms an emitter Schottky contact 19 on the n-layer 3, and the collector contact connection 11 forms a collector Schottky contact 14 on the n-layer 3.

Figure 5:
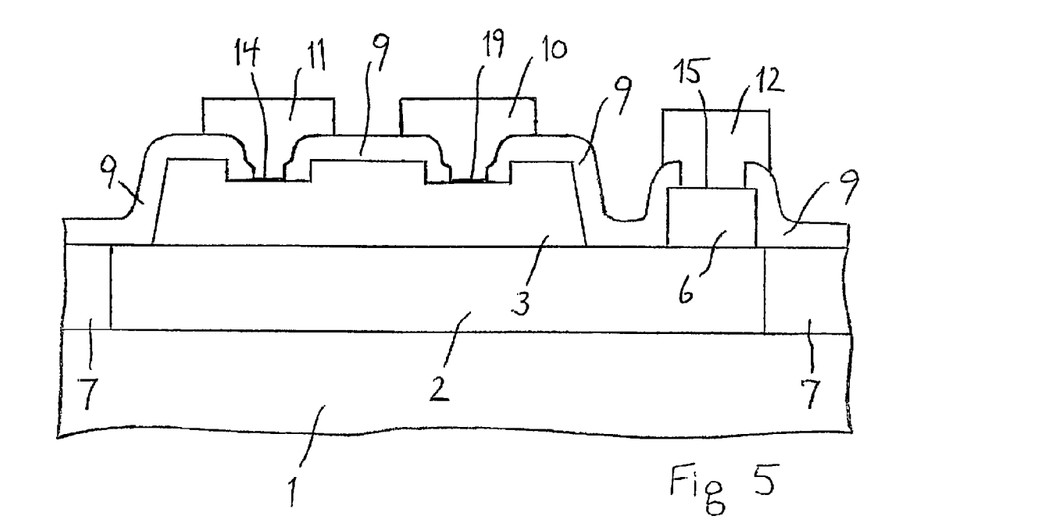
FIG. 5 shows a cross-section of a further embodiment of the bipolar transistor with n-type base according to FIG. 4.

FIG. 5 shows a cross-section of a further embodiment, which is comparable to the embodiment of FIG. 4, but comprises no p$^+$-layer 4. The other components of this embodiment are similar to the corresponding components of the previously described embodiments.

The described embodiments show several ways to realize a bipolar transistor with n-type base in GaAs technology without having to depart from standard process steps. The invention therefore offers a practical way to integrate bipolar transistor with n-type base together with npn-type devices in the same IC chip on GaAs.

The following list of reference numerals can be used with the drawings.

substrate
n+-region
n-layer
p$^+$-layer
emitter contact layer
base contact layer
isolating region
space charge region
dielectric layer
emitter contact connection
collector contact connection
base contact connection
emitter contact
collector Schottky contact
base contact
mesa
collector contact layer
collector contact
emitter Schottky contact

The invention claimed is:

1. A bipolar transistor, comprising:
an n-layer having a surface,
a base contact connection electrically conductively connected to the n-layer,
an emitter structure,
an emitter contact connection, which is a metal, electrically conductively connected to the emitter structure,
a collector structure arranged laterally to the emitter structure with respect to the surface of the n-layer, and
a collector contact connection, which is a metal, electrically conductively connected to the collector structure,
wherein at least one of the emitter contact connection and/or the collector contact connection forms a Schottky contact on the surface of the n-layer.

2. The bipolar transistor of claim 1, wherein the emitter structure comprises a p$^+$-layer that is arranged on the surface of the n-layer, and the collector contact connection forms a collector Schottky contact on the surface of the n-layer.

3. The bipolar transistor of claim 2, further comprising an emitter contact layer, which is a metal, forming an ohmic contact on the p$^+$-layer, the emitter contact layer carrying the emitter contact connection.

4. The bipolar transistor of claim 1, wherein the emitter contact connection forms an emitter Schottky contact on the surface of the n-layer, and the collector structure comprises a p$^+$-layer that is arranged on the surface of the n-layer.

5. The bipolar transistor of claim 4, further comprising a collector contact layer, which is a metal, forming an ohmic contact on the p$^+$-layer, the collector contact layer carrying the collector contact connection.

6. The bipolar transistor of claim 1, wherein the emitter contact connection forms an emitter Schottky contact on the surface of the n-layer and the collector contact connection forms a collector Schottky contact on the surface of the n-layer.

7. The bipolar transistor of claim 1, further comprising:
a substrate having a surface, and
an n$^+$-region at the surface of the substrate, the n-layer being arranged on the n$^+$-region,
wherein the base contact connection is arranged above an area of the n$^+$-region that is not covered by the n-layer.

8. The bipolar transistor of claim 7, further comprising a base contact layer, which is a metal, forming an ohmic contact on the n$^+$-region, the base contact connection being arranged on the base contact layer.

9. The bipolar transistor of claim 1, wherein the n-layer is part of a mesa.

10. The bipolar transistor of claim 1, further comprising a substrate, the bipolar transistor and a vertical npn bipolar transistor being arranged on the substrate, the n-layer also being provided for a collector layer of the npn bipolar transistor.

11. A method of forming a bipolar transistor with an n-type base, the method comprising:
forming an n-layer of semiconductor material,
forming an emitter structure on the n-layer by either a) forming a p$^+$-layer on the n-layer, and forming a metal emitter contact layer on the p$^+$-layer or b) forming a metal emitter contact connection on the n-layer, and forming an emitter Schottky contact on the n-layer, and
forming a collector structure on the n-layer by either a) forming a p$^+$-layer on the n-layer, and forming a metal collector contact layer on the p$^+$-layer or b) forming a metal collector contact connection on the n-layer, and forming a collector Schottky contact on the n-layer, wherein at least one of the emitter contact connection and/or the collector contact connection form a Schottky contact on an area of the surface of the n-layer.

12. A method of forming a bipolar transistor, the method comprising:
forming an $n^+$-region,
forming an n-layer on the $n^+$-region,
forming a $p^+$-layer on the n-layer,
forming an emitter contact layer on the $p^+$-layer,
forming a base contact layer on the $n^+$-region,
forming a metal emitter contact connection on the emitter contact layer,
applying a metal base contact connection on the base contact layer, and
applying a metal collector contact connection on the n-layer, the collector contact connection forming a collector Schottky contact on the n-layer.

13. The method of claim 12, wherein the emitter contact layer and the base contact layer are formed from a metal.

14. The method of claim 12, further comprising forming an additional npn bipolar transistor, in which the $n^+$-region forms a subcollector layer, the n-layer forms a collector layer, and the $p^+$-layer forms a base layer.

15. The method of claim 11, wherein forming the emitter structure comprises forming the $p^+$-layer on the n-layer and forming the metal emitter contact layer on the $p^+$-layer and wherein forming the collector structure comprises forming the $p^+$-layer on the n-layer and forming the metal collector contact layer on the $p^+$-layer.

16. The method of claim 11, wherein forming the emitter structure comprises forming the metal emitter contact connection on the n-layer and forming the emitter Schottky contact on the n-layer, and wherein forming the collector structure comprises forming the metal collector contact connection on the n-layer and forming the collector Schottky contact on the n-layer.

* * * * *

UNITED STATES PATENT AND TRADEMARK OFFICE
CERTIFICATE OF CORRECTION

PATENT NO. : 8,410,572 B2  Page 1 of 1
APPLICATION NO. : 13/124091
DATED : April 2, 2013
INVENTOR(S) : Léon C. M. van den Oever It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 10 days.

Signed and Sealed this

First Day of September, 2015

Michelle K. Lee
*Director of the United States Patent and Trademark Office*